(12) United States Patent
Horng et al.

(10) Patent No.: US 12,249,974 B2
(45) Date of Patent: *Mar. 11, 2025

(54) CRYSTAL OSCILLATOR AND METHOD OF MAKING THE SAME

(71) Applicant: AKER TECHNOLOGY CO., LTD., Taichung (TW)

(72) Inventors: Ray-Hua Horng, Taichung (TW); Yi-Lun Lin, Taichung (TW)

(73) Assignee: AKER TECHNOLOGY CO., LTD., Taichung (TW)

( * ) Notice: Subject to any disclaimer, the term of this patent is extended or adjusted under 35 U.S.C. 154(b) by 73 days.

This patent is subject to a terminal disclaimer.

(21) Appl. No.: 18/306,619

(22) Filed: Apr. 25, 2023

(65) Prior Publication Data

US 2023/0387884 A1 Nov. 30, 2023

(30) Foreign Application Priority Data

May 31, 2022 (TW) .................................. 111120274

(51) Int. Cl.
*H03H 9/19* (2006.01)
*H03H 3/02* (2006.01)
*H03H 9/13* (2006.01)

(52) U.S. Cl.
CPC ................ *H03H 9/19* (2013.01); *H03H 3/02* (2013.01); *H03H 9/132* (2013.01)

(58) Field of Classification Search
CPC ............ H03H 9/19; H03H 3/02; H03H 9/132; H03H 9/02055; H03H 2003/022; H03H 9/0538; H03H 9/13

(Continued)

(56) References Cited

U.S. PATENT DOCUMENTS

| 6,114,801 A | 9/2000 | Tanaka et al. |
| 2015/0325776 A1 | 11/2015 | Kohda |

(Continued)

FOREIGN PATENT DOCUMENTS

| JP | 2000-323954 A | 11/2000 |
| JP | 2005-303825 A | 10/2005 |

(Continued)

OTHER PUBLICATIONS

Search Report issued in Taiwanese patent application No. 111120274, dated Jan. 12, 2023.

(Continued)

*Primary Examiner* — Richard Tan
(74) *Attorney, Agent, or Firm* — Birch, Stewart, Kolasch & Birch, LLP

(57) ABSTRACT

A crystal oscillator includes a piezoelectric substrate having a thinned portion with opposite upper and lower surfaces respectively defining upper and lower surface work portions, and at least one side portion having at least one recessed portion with a bottom surface flush with the upper surface of the thinned portion. A top electrode layer has a top work portion disposed on the upper surface work portion, and a top extension extending from the top work portion onto the bottom surface of the recessed portion. A bottom electrode layer has a bottom work portion disposed on the lower surface work portion, and a bottom extension extending from the bottom work portion toward the one end of the thinned portion and then bending upward and inward onto the bottom surface of the recessed portion. A method of making the crystal oscillator is also disclosed.

6 Claims, 9 Drawing Sheets

(58) Field of Classification Search
USPC .......................................................... 331/158
See application file for complete search history.

(56) References Cited

U.S. PATENT DOCUMENTS

2023/0064715 A1* 3/2023 Horng ..................... H10N 30/85
2024/0235477 A1* 7/2024 Horng ..................... H03H 9/19

FOREIGN PATENT DOCUMENTS

| JP | 2005303825 | * 10/2005 |
| JP | 2013-93654 A | 5/2013 |
| TW | I401882 B | 7/2013 |

OTHER PUBLICATIONS

Extended European Search Report for European Application No. 23172124.2, dated Oct. 25, 2023.
Kubena et al., "A Fully Integrated Quartz MEMS VHF TCXO," Joint Conference of the European Frequency and Time Forum and IEEE International Frequency Control Symposium, 2017, pp. 68-71.
Kubena et al., "Next Generation Quartz Oscillators and Filters for VHF-UHF Systems," IEEE Microwave Symposium Digest, 2006, pp. 668-671.

* cited by examiner

CRYSTAL OSCILLATOR AND METHOD OF MAKING THE SAME

CROSS-REFERENCE TO RELATED APPLICATION

This application claims priority to Taiwanese Invention Patent Application No. 111120274, filed on May 31, 2022.

FIELD

The disclosure relates to a crystal oscillator and a method of making the same.

BACKGROUND

A crystal oscillator is a component that uses the piezoelectric effect of the quartz crystal itself to generate an oscillation frequency, and is often configured in various electronic products, such as communication equipment. A conventional crystal oscillator generally includes a quartz substrate, and top and bottom electrodes respectively formed on top and bottom surfaces of the quartz substrate. The bottom electrode extends from the bottom surface to a side peripheral surface up to the top surface of the quartz substrate, so that the top and bottom electrodes can be located on the same surface for external electrical connection.

It is well known to research and development personnel and industry practitioners who are familiar with the related technical fields of the crystal oscillator that the thinner the quartz substrate, the higher the oscillation frequency it can generate. Therefore, in order for the crystal oscillator to be applied in the high frequency band, the quartz substrate must be thinned so that its thickness can reach the required high frequency oscillation band.

Referring to FIGS. 1 and 2, a crystal oscillator 1, as disclosed in Taiwanese Invention Patent No. TWI401882, includes a crystal substrate 11, a top excitation electrode 12, and a bottom excitation electrode 13. The crystal substrate 11 has a thinned portion 111 defining an upper work surface 1111 and a lower work surface 1112, and a border portion 112 surrounding the thinned portion 111 and having a thickness greater than that of the thinned portion 111. The top excitation electrode 12 has an upper work electrode portion 121 disposed on the upper work surface 1111, and an upper pull electrode area 122 extending from the upper work electrode portion 121 to the border portion 112. The bottom excitation electrode 13 has a lower work electrode portion 131 disposed on the lower work surface 1112, and a lower pull electrode area 132 extending from the lower work electrode portion 131 to the border portion 112. The lower pull electrode area 132 has a first section 1321 connected to the lower work electrode portion 131, and a second section 1322 extending from the first section 1321 to a top surface of the border portion 112.

Although the crystal substrate 11 of the crystal oscillator 1 has the thinned portion 111 for the upper and lower work electrode portions 121, 131 to be disposed thereon, because the thickness of the thinned portion 111 is smaller than that of the border portion 112 so that there is a height difference therebetween, this causes the structure of the upper pull electrode area 122 of the top excitation electrode 12 to reduce its yield during the manufacturing process, and the integrity of the circuit structure of the top excitation electrode 12 is also affected.

SUMMARY

Therefore, an object of the present disclosure is to provide a crystal oscillator that has an integrated circuit structure and that can alleviate at least one of the drawbacks of the prior art.

According to this disclosure, the crystal oscillator includes a piezoelectric substrate, a top electrode layer, and a bottom electrode layer.

The piezoelectric substrate includes a thinned portion, at least one side portion extending upwardly from one end of the thinned portion, and a cavity defined by the thinned portion and the at least one side portion. The thinned portion has opposite upper and lower surfaces respectively defining an upper surface work portion and a lower surface work portion that are spaced apart from a plurality of ends of the thinned portion. The upper surface of the thinned portion faces the cavity. The at least one side portion has at least one recessed portion extending inwardly from a top surface thereof and communicating with the cavity. The upper surface of the thinned portion and a bottom surface of the at least one recessed portion are flush with each other.

The top electrode layer is disposed on the upper surface of the thinned portion, and has a top work portion disposed on the upper surface work portion, and a top extension extending from the top work portion onto the bottom surface of the at least one recessed portion. The bottom electrode layer is disposed on the lower surface of the thinned portion, and has a bottom work portion disposed on the lower surface work portion, and a bottom extension extending from the bottom work portion toward the one end of the thinned portion and then bending upward and inward onto the bottom surface of the at least one recessed portion.

Another object of this disclosure is to provide a method of making a crystal oscillator that can resolve the problem caused by height difference to improve the process yield.

According to this disclosure, the method of making a crystal oscillator comprises the steps of:

(a) forming a bottom electrode layer on a lower surface of a piezoelectric substrate, the bottom electrode layer having a bottom work portion spaced apart from a plurality of edges of the lower surface of the piezoelectric substrate, and a bottom extension extending from the bottom work portion toward one edge of the lower surface of the piezoelectric substrate;

(b) adhering a temporary substrate to the lower surface of the piezoelectric substrate so as to cover the bottom electrode layer;

(c) patterning an upper surface of the piezoelectric substrate that is opposite to the lower surface thereof so that the piezoelectric substrate is formed with a thinned portion and at least one side portion located on one end of the thinned portion, the thinned portion having the lower surface of the piezoelectric substrate and an upper surface opposite to the lower surface, the upper surface and the lower surface respectively defining an upper surface work portion and a lower surface work portion spaced apart from a plurality of ends of the thinned portion, the lower surface work portion being formed with the bottom work portion of the bottom electrode layer, the at least one side portion having at least one recessed portion extending inwardly from a top surface thereof, wherein the upper surface of the thinned portion and a bottom surface of the at least one recessed portion are flush with each other;

(d) forming a top electrode layer on the upper surface of the thinned portion, the top electrode layer having a top work portion located on the upper surface work portion, and a top extension extending from the top work portion onto the bottom surface of the at least one recessed portion; and (e) removing the temporary substrate from the lower surface of the piezoelectric substrate to expose the bottom electrode layer.

BRIEF DESCRIPTION OF THE DRAWINGS

Other features and advantages of the disclosure will become apparent in the following detailed description of the embodiment with reference to the accompanying drawings. It is noted that various features may not be drawn to scale.

DETAILED DESCRIPTION

Figure 14:
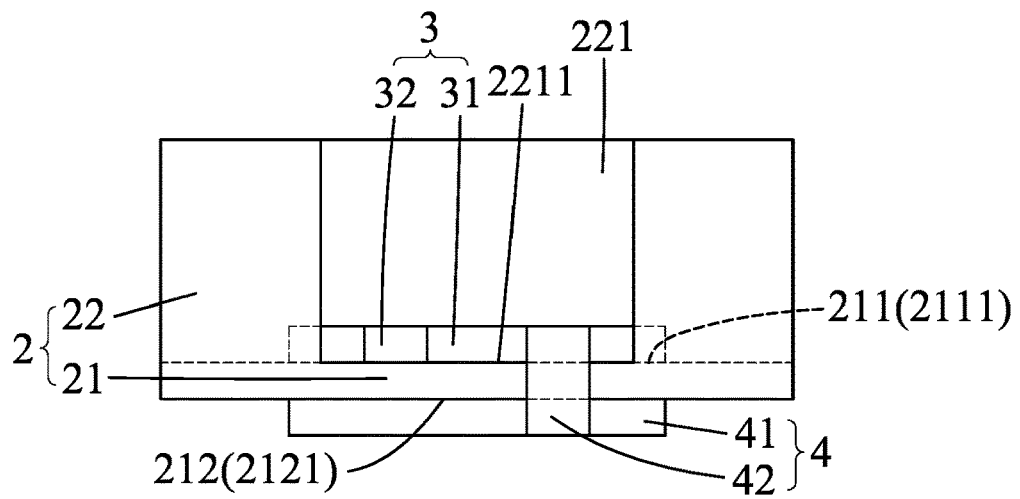
FIG. 14 is a left side view illustrating a step of forming a second section and a third section of a bottom electrode layer after step (e) of the method of this embodiment.
Figure 15:
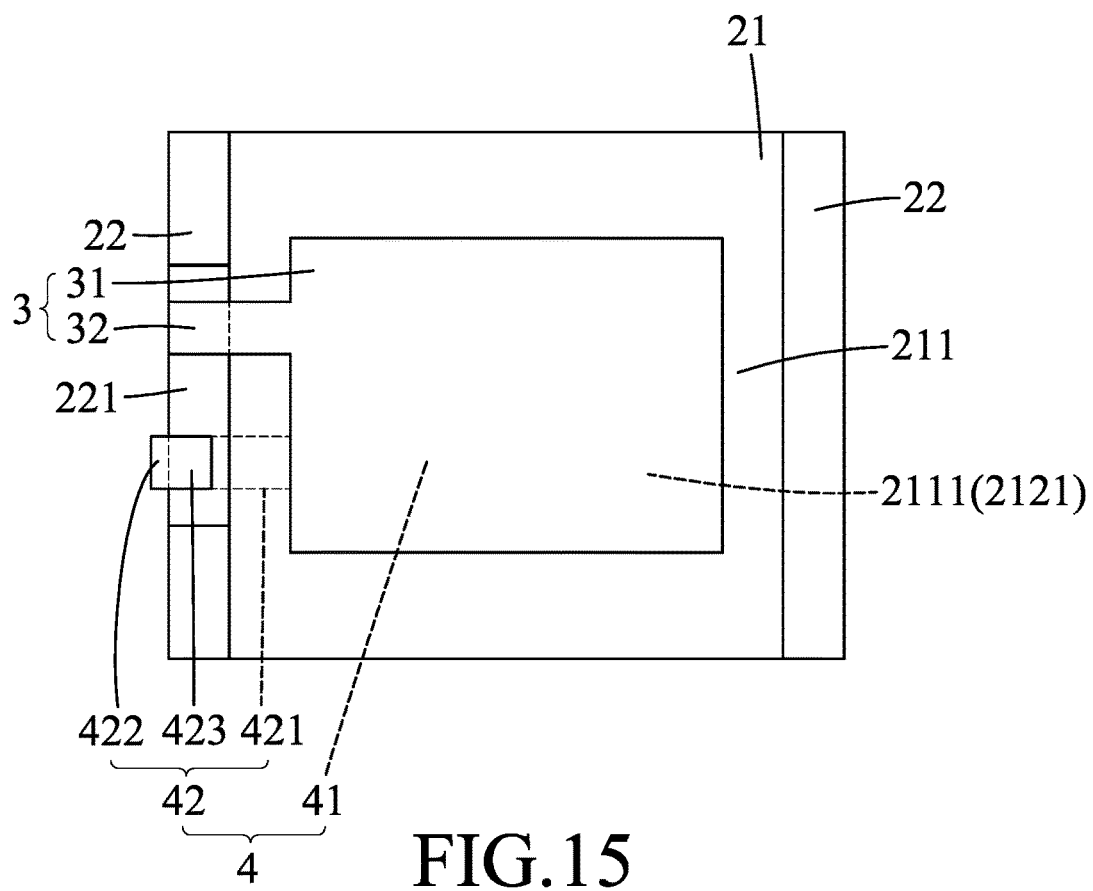
FIG. 15 is a top view of FIG. 14.
Figure 16:
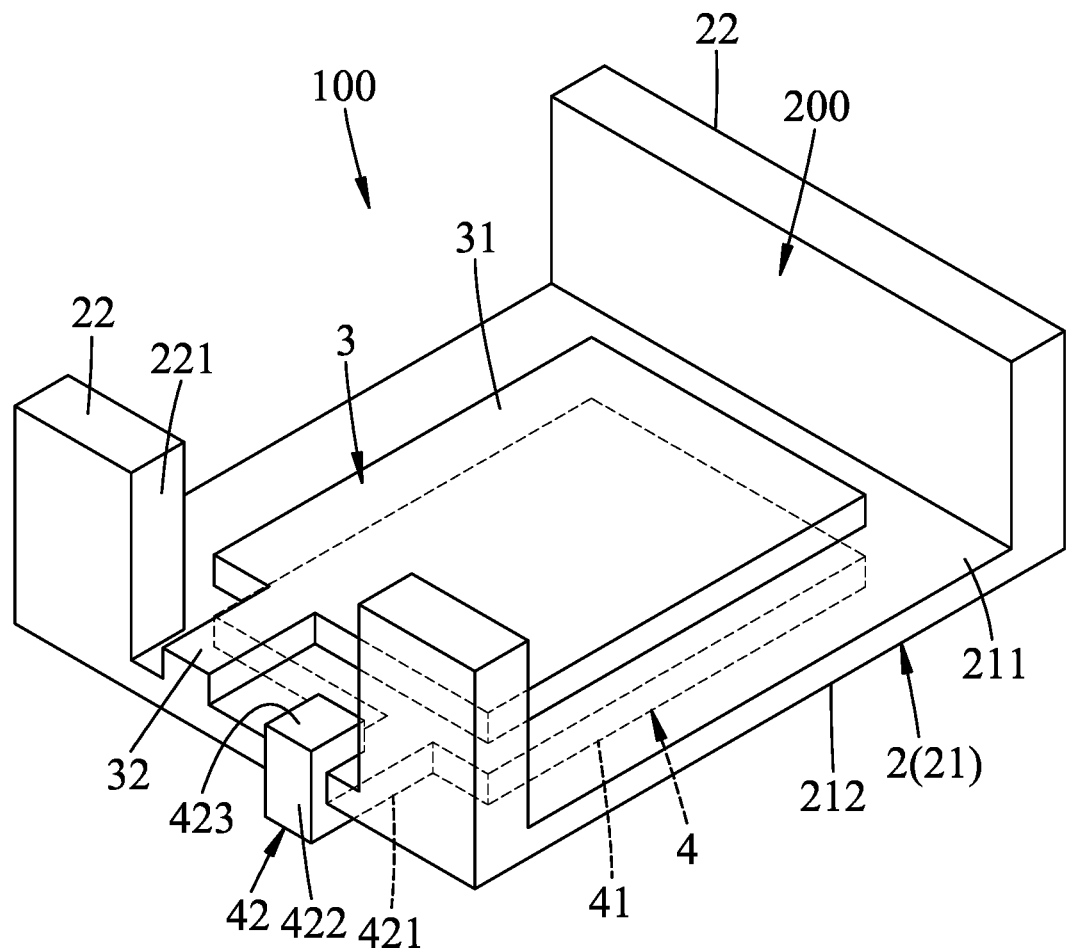
FIG. 16 is a perspective view of a crystal oscillator obtained from the method of this embodiment.

Referring to FIGS. 14 to 16, a crystal oscillator 100 according to an embodiment of the present disclosure includes a piezoelectric substrate 2, a top electrode layer 3, and a bottom electrode layer 4. In this embodiment, the piezoelectric substrate 2 is exemplified as a quartz substrate.

The piezoelectric substrate 2 includes a thinned portion 21, two side portions 22 extending upwardly from two opposite ends of the thinned portion 21, and a cavity 200 defined by the thinned portion 21 and the two side portions 22. The thinned portion 21 has opposite upper and lower surfaces 211, 212 respectively defining an upper surface work portion 2111 and a lower surface work portion 2121 that are spaced apart from a plurality of ends of the thinned portion 21. The upper surface 211 faces the cavity 200. A left one of the side portions 22 has a recessed portion 221 extending inwardly from a top surface thereof and communicating with the cavity 200. With reference to FIG. 14, the upper surface 211 of the thinned portion 21 and a bottom surface 2211 of the recessed portion 221 are flush with each other.

The top electrode layer 3 is disposed on the upper surface 211 of the thinned portion 21, and has a top work portion 31 disposed on the upper surface work portion 2111, and a top extension 32 extending from the top work portion 31 onto the bottom surface 2211 of the recessed portion 221.

The bottom electrode layer 4 is disposed on the lower surface 212 of the thinned portion 21, and has a bottom work portion 41 disposed on the lower surface work portion 2121, and a bottom extension 42 extending from the bottom work portion 41 toward a left end of the thinned portion 21 and then bending upward and inward onto the bottom surface 2211 of the recessed portion 221.

In this embodiment, the top work portion 31 and the bottom work portion 41 are respectively located on the upper surface work portion 2111 and the lower surface work portion 2121 of the thinned portion 21 and correspond in position to each other, so that the top work portion 31, the thinned portion 21 and the bottom work portion 41 form a sandwich structure. When the top and bottom electrode layers 3, 4 are energized, the piezoelectric substrate 2 is caused to oscillate.

With reference to FIGS. 14 and 15, in this embodiment, the bottom extension 42 has a first section 421 connected to the bottom work portion 41 and extending toward the left end of the thinned portion 21, a second section 422 extending upwardly from an outer end of the first section 421, and a third section 423 extending inwardly from one end of the second section 422 that is opposite to the first section 421 onto the bottom surface 2211 of the recessed portion 221 and spaced apart from the top extension 32.

It should be added that the recessed portion 221 and the third section 423 of the bottom extension 42 of this embodiment are described based on the structures shown in FIGS. 14 to 16. That is, the piezoelectric substrate 2 has a single recessed portion 221 provided on one of the side portions 22 thereof, so that the top extension 32 of the top electrode layer 3 and the third section 423 of the bottom extension 42 of the bottom electrode layer 4 are disposed on the bottom surface 2211 of the recessed portion 221 in a spaced apart manner, but not limited thereto. It should be understood that the side portion 22 on the right side of FIG. 15 or FIG. 16 may also be provided with a recessed portion 221 (not shown), and the bottom extension 42 may extend from the bottom work portion 41 to the right side portion 22 so that the third section 423 thereof may be located on the bottom surface 2211 (not shown) of the recessed portion 221 of the right side portion 22.

A method of making the crystal oscillator 100 of this embodiment includes steps (a) to (e), which will be described in detail below in combination with FIGS. 3 to 16.

Figure 1:
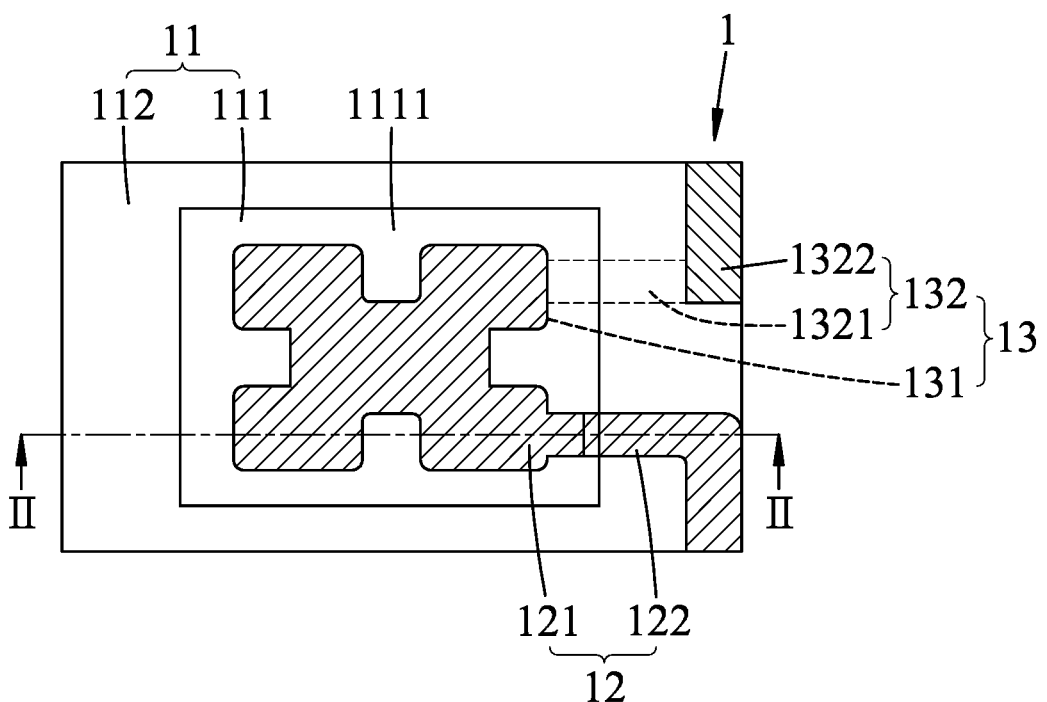
FIG. 1 is a top view of a crystal oscillator disclosed in Taiwanese Invention Patent No. TWI401882.
Figure 2:
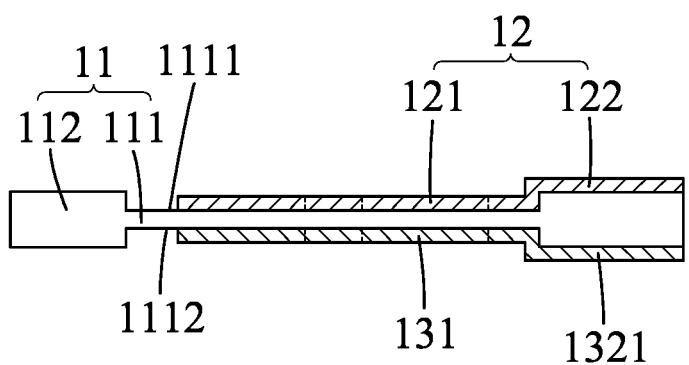
FIG. 2 is a sectional view taken along line II-II of FIG. 1.
Figure 3:
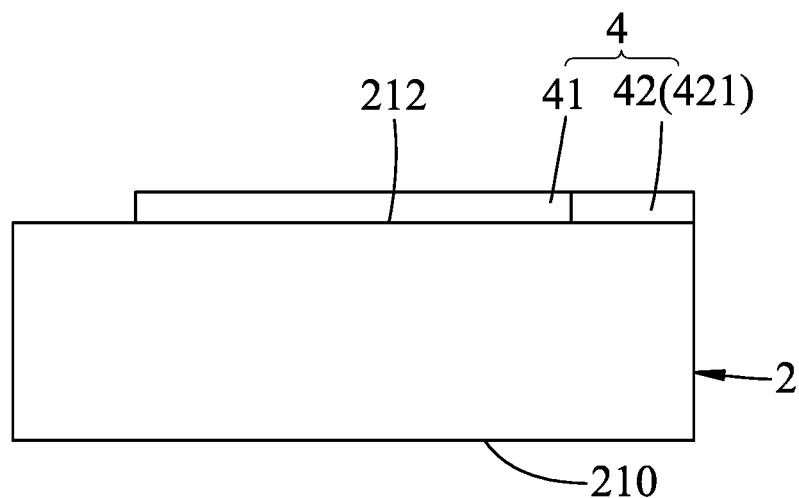
FIG. 3 is a side view illustrating step (a) of a method of making a crystal oscillator according to an embodiment of the present disclosure.
Figure 4:
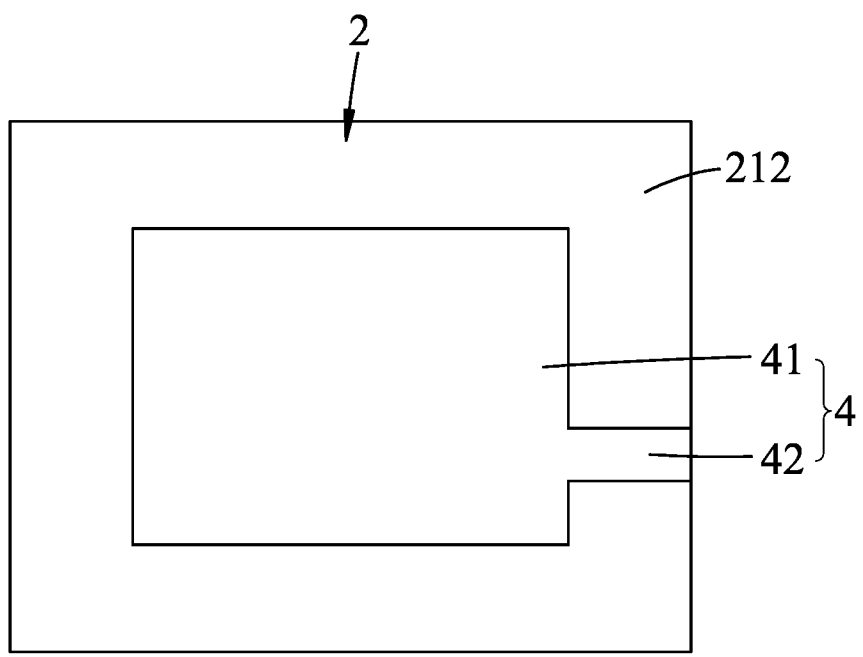
FIG. 4 is a top view of FIG. 3.

In step (a), with reference to FIGS. 3 and 4, the bottom electrode layer 4 is formed on the lower surface 212 of the piezoelectric substrate 2. The bottom electrode layer 4 has the bottom work portion 41 spaced apart from a plurality of edges of the lower surface 212, and the bottom extension 42 extending from the bottom work portion 41 toward one edge of the lower surface 212. The piezoelectric substrate 2 shown in FIG. 3 has the lower surface 212 facing upward to facilitate the next step.

Figure 5:
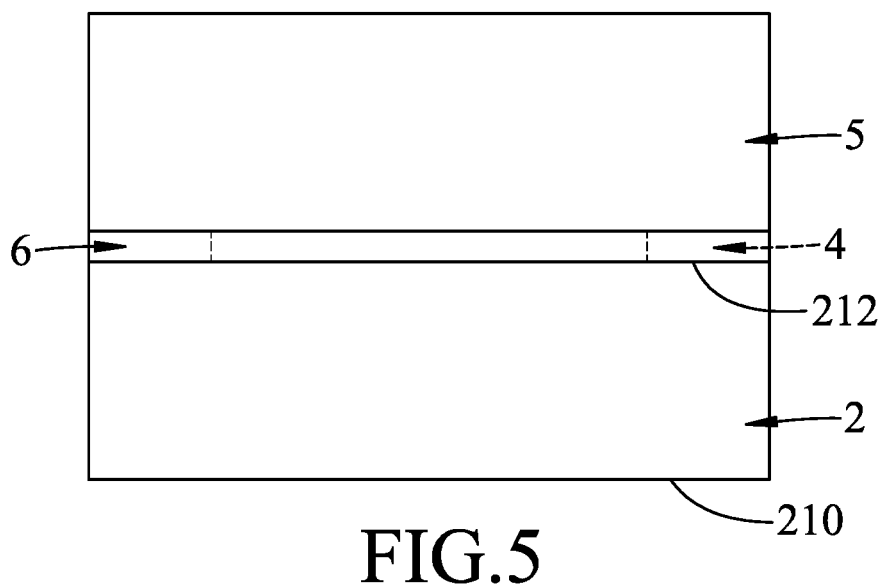
FIG. 5 is a side view illustrating step (b) of the method of this embodiment.
Figure 6:
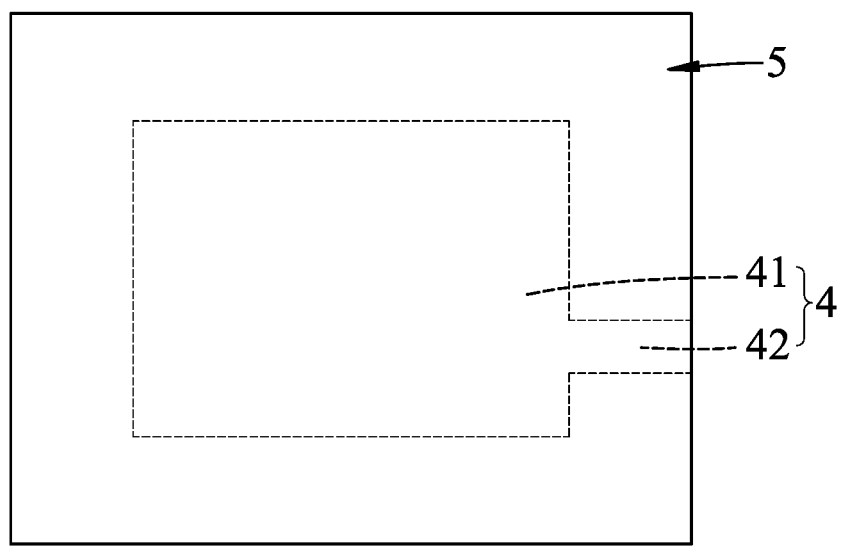
FIG. 6 is a top view of FIG. 5.

In step (b), with reference to FIGS. 5 and 6, a temporary substrate 5 is adhered to the lower surface 212 of the piezoelectric substrate 2 so as to cover the bottom electrode layer 4. The temporary substrate 5 can be adhered to the lower surface 212 of the piezoelectric substrate 2 using a wax material 6, an ultraviolet releasable material or a heat releasable material. In this embodiment, the temporary substrate 5 is adhered to the lower surface 212 using the wax material 6, but is not limited thereto.

Figure 7:
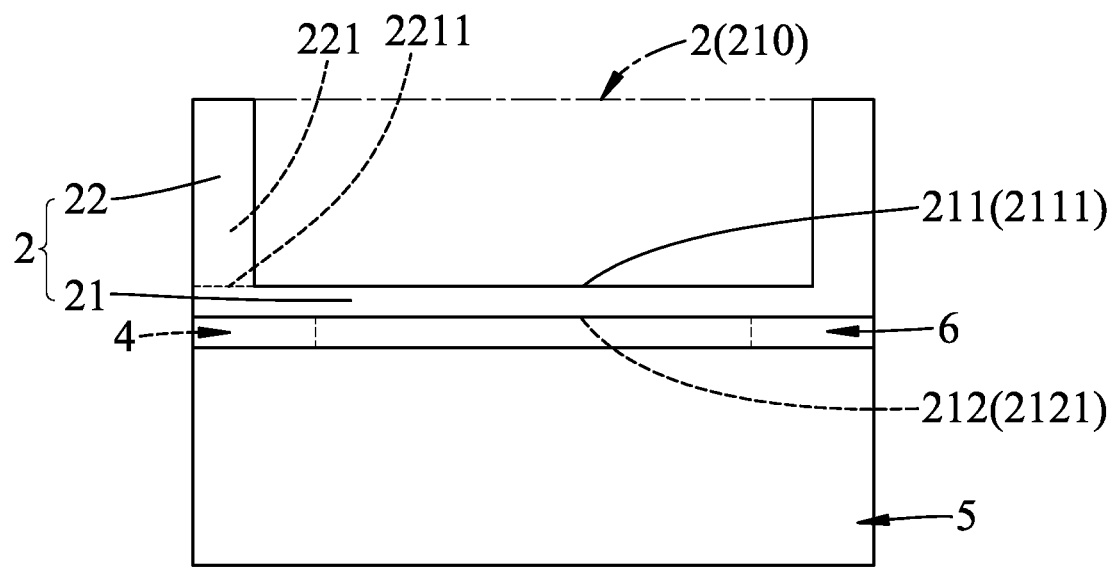
FIG. 7 is a side view illustrating step (c) of the method of this embodiment.
Figure 8:
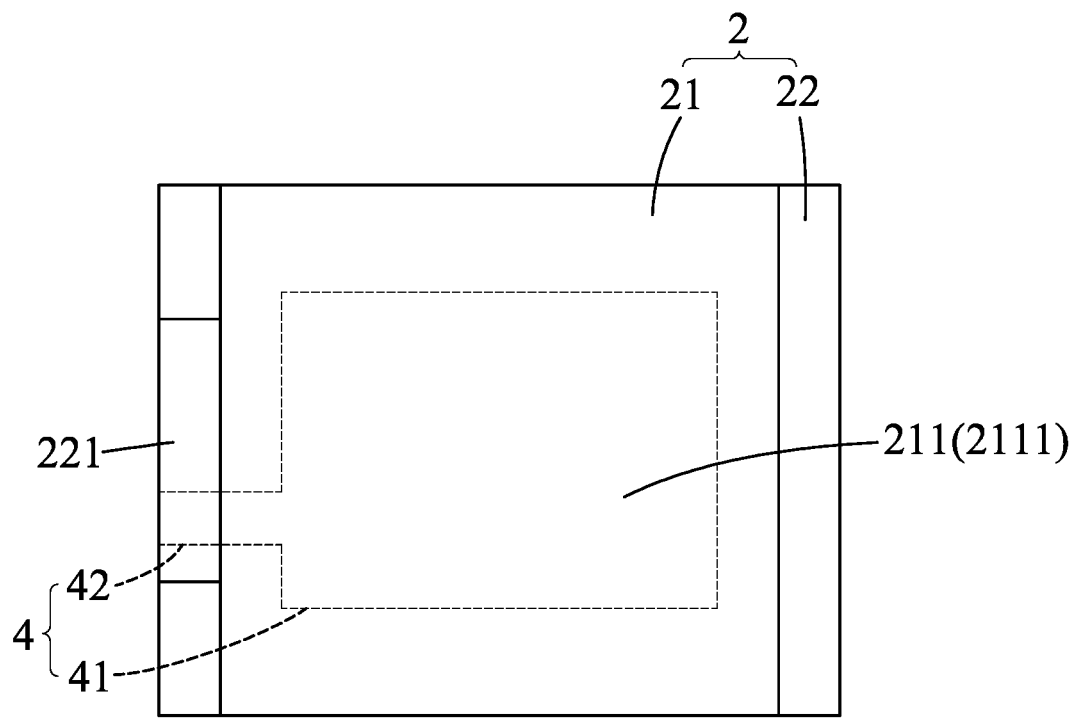
FIG. 8 is a top view of FIG. 7.

In step (c), with reference to FIGS. 7 and 8, an upper surface 210 of the piezoelectric substrate 2 that is opposite to the lower surface 212 thereof is patterned so that the piezoelectric substrate 2 is formed with the thinned portion 21 and the two side portions 22 located at two opposite ends of the thinned portion 21. The thinned portion 21 has the lower surface 212 of the piezoelectric substrate 2, and the upper surface 211 opposite to the lower surface 212. The upper and lower surfaces 211, 212 respectively define the upper and lower surface work portions 2111, 2121 which are spaced apart from a plurality of the ends of the thinned portion 21. The lower surface work portion 2121 is formed with the bottom work portion 41 of the bottom electrode layer 4. The left side portion 22 of the piezoelectric substrate 2 has the recessed portion 221 extending inwardly from the top surface thereof. The upper surface 211 of the thinned portion 21 and the bottom surface 2211 of the recessed portion 221 are flush with each other.

A patterning means suitable for step (c) of this embodiment is to first form a mask layer (not shown) having a predetermined pattern on the upper surface 210 of the piezoelectric substrate 2, after which the upper surface 210 of the piezoelectric substrate 2 is wet etched or dry etched to remove an area not covered by the mask layer, thereby forming the piezoelectric substrate 2 with the thinned portion 21 and the two side portions 22. However, the predetermined pattern of the mask layer may also allow the piezoelectric substrate 2 to include only one side portion 22 (i.e., a left side part of FIG. 8) located on one end of the thinned portion 21.

Figure 9:
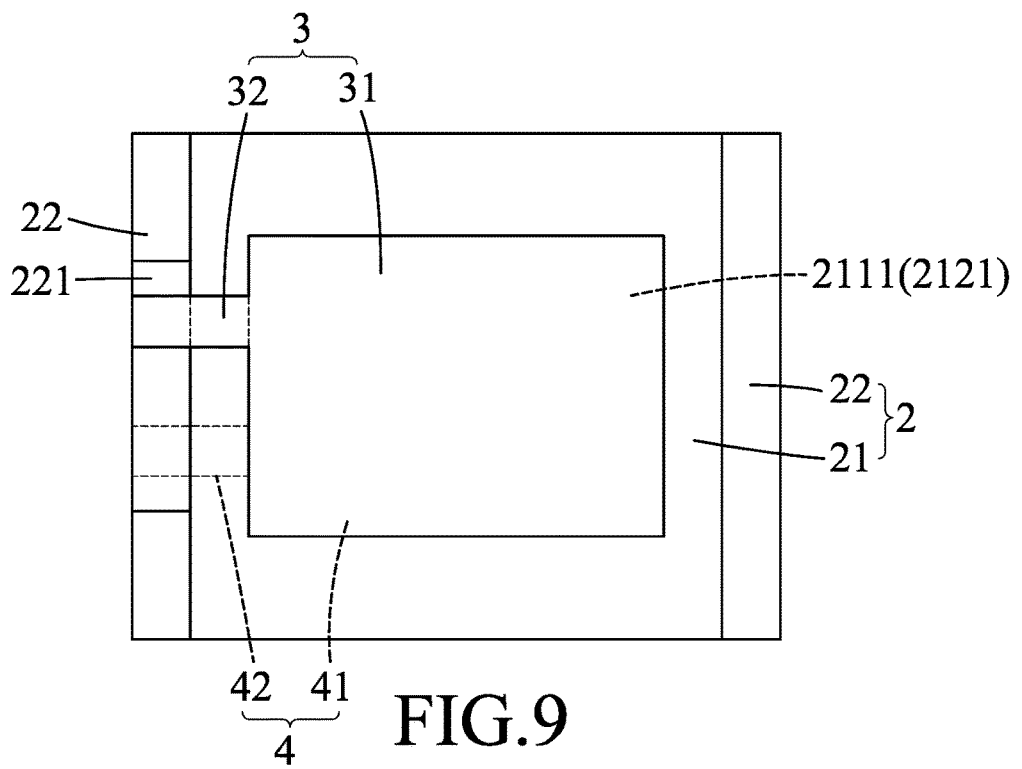
FIG. 9 is a top view illustrating step (d) of the method of this embodiment.
Figure 10:
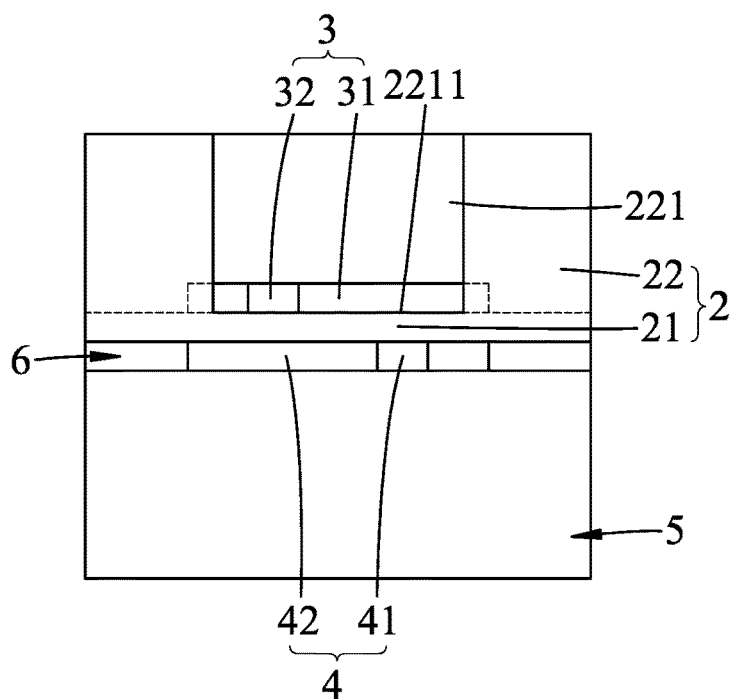
FIG. 10 is a left side view of FIG. 9.

In step (d), with reference to FIGS. 9 and 10, the top electrode layer 3 is formed on the upper surface 211 of the thinned portion 21, and has the top work portion 31 located on the upper surface work portion 2111, and the top extension 32 extending from the top work portion 31 onto the bottom surface 2211 of the recessed portion 221. In this embodiment, the top work portion 31 and the bottom work portion 41 are respectively located on the upper surface work portion 2111 and the lower surface work portion 2121 of the thinned portion 21 and correspond in position to each other, so that the top work portion 31, the thinned portion 21 and the bottom work portion 41 form a sandwich structure.

Figure 11:
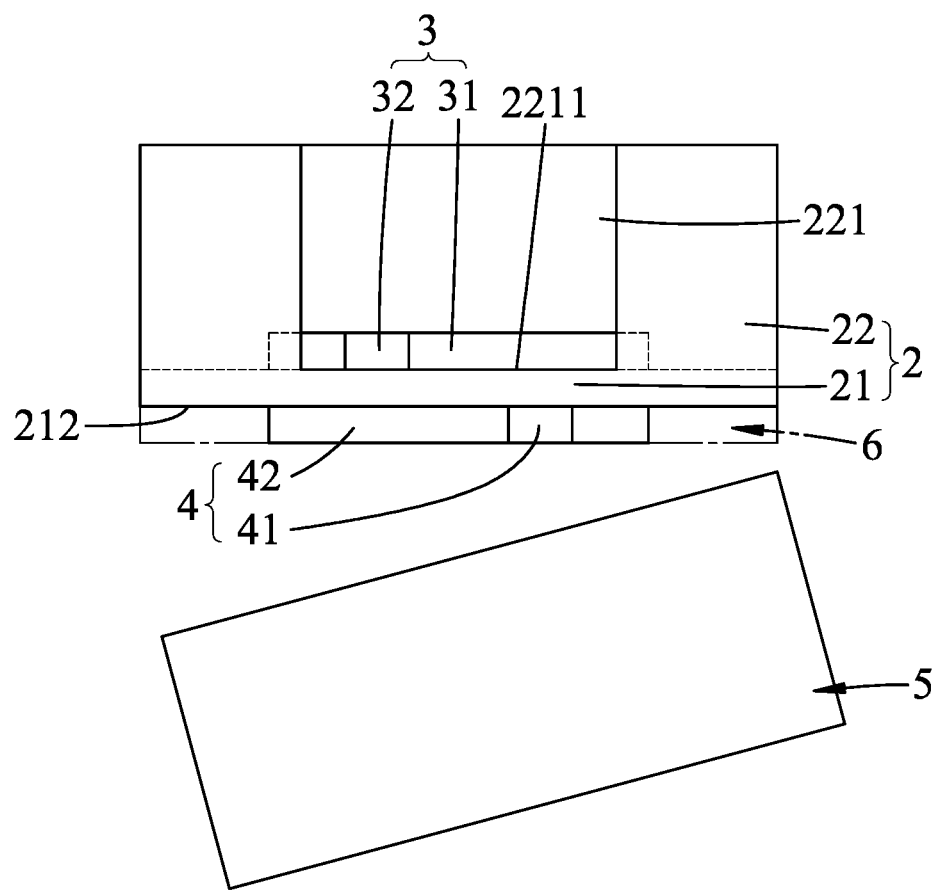
FIG. 11 is a view similar to FIG. 10, but illustrating step (e) of the method of this embodiment.

In step (e), with reference to FIG. 11, the temporary substrate 5 is removed from the lower surface 212 of the piezoelectric substrate 2 to expose the bottom electrode layer 4. The temporary substrate 5 is removed from the lower surface 212 of the piezoelectric substrate 2 by melting the wax material 6 at a temperature higher than a melting point thereof, so that the temporary substrate 5 can be separated from the lower surface 212 of the piezoelectric substrate 2. It should be added that, when step (b) is carried out through the ultraviolet or heat releasable material, the temporary substrate 5 can be removed by means of lighting or heating.

Figure 12:
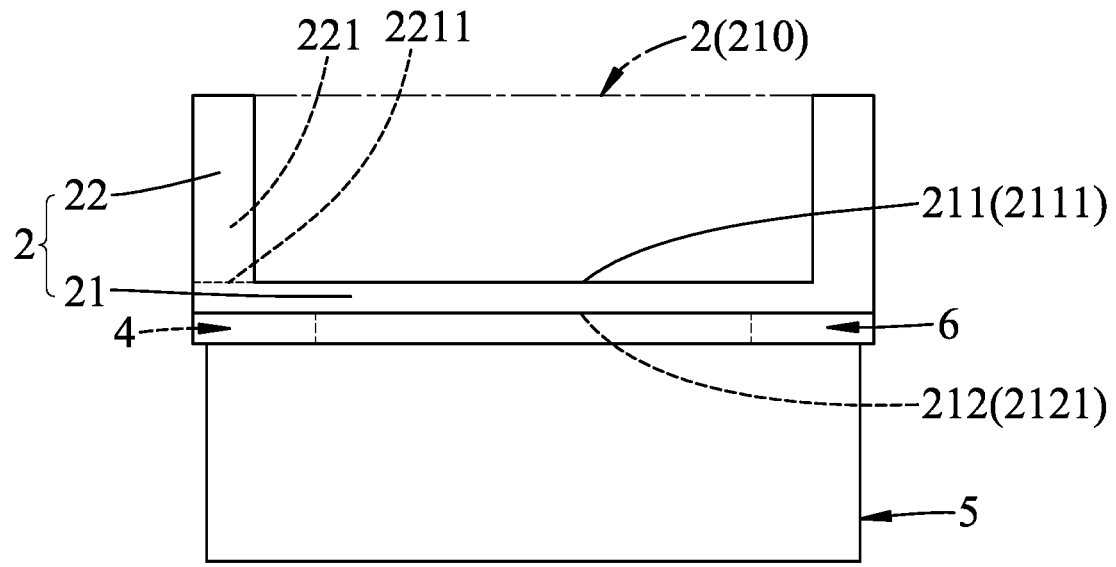
FIG. 12 is a view similar to FIG. 7, but illustrating an alternative form of a temporary substrate.
Figure 13:
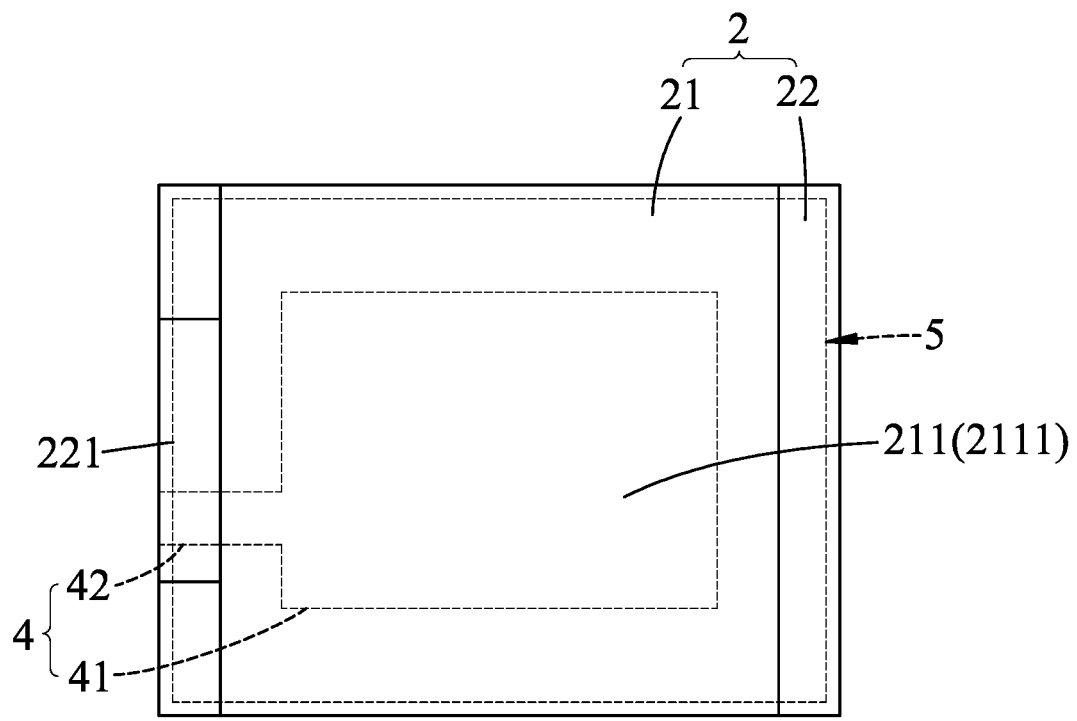
FIG. 13 is a top view of FIG. 12.

Specifically, in step (a), with reference to FIGS. 3 and 4, the bottom work portion 41 and the first section 421 of the bottom extension 42 of the bottom electrode layer 4 are formed on the lower surface 212 of the piezoelectric substrate 2. The first section 421 is formed by coating silver paste that extends from the bottom work portion 41 toward one edge of the lower surface 212. Further, a step of forming the second and third sections 422, 423 of the bottom extension 42 of the bottom electrode layer 4 may be performed after step (c) or step (e). In this embodiment, the step of forming the second and third sections 422, 423 of the bottom extension 42 is performed after step (e). The reason for this is that the temporary substrate 5 has a size equal to that of the piezoelectric substrate 2, so that the process of forming the second and third sections 422, 423 of the bottom extension 42 of the bottom electrode layer 4 can only be performed after the temporary substrate 5 is removed. However, when the dimensions of four lateral sides of the temporary substrate 5 are smaller than those of the piezoelectric substrate 2, as shown in FIGS. 12 and 13, the step of forming the second and third sections 422, 423 of the bottom extension 42 is performed after step (c).

Concretely speaking, with reference to FIGS. 14 and 15, the step of forming the second and third sections 422, 423 of the bottom extension 42 of this embodiment is performed by using a robotic arm (not shown) to coat silver paste from an outer end of the first section 421, moving upward on the left end of the thinned portion 21 and then inward onto the bottom surface 2211 of the recessed portion 221 so as to respectively form the second and third sections 422, 423 of the bottom extension 42.

In summary, in the crystal oscillator 100 of this disclosure and the method of making the same, the top extension 32 of the top electrode layer 3 is located at the bottom surface 2211 of the recessed portion 221 which is formed on the left side portion 22 of the piezoelectric substrate 2, the top work portion 31 of the top electrode layer 3 is located at the upper surface work portion 2111 of the thinned portion 21, and the upper surface 211 of the thinned portion 21 and the bottom surface 2211 of the recessed portion 221 are flush with each other. Hence, on the premise of thinning the crystal oscillator 100, the problem of insufficient circuit integrity due to the height difference between the thinned portion 21 and the side portion 22 can be resolved so as to maintain the desired yield of the process. Therefore, the object of this disclosure can indeed be achieved.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:
1. A crystal oscillator, comprising:
a piezoelectric substrate including a thinned portion, two side portions extending upwardly from two opposite ends of said thinned portion, and a cavity defined by said thinned portion and said two side portions, said thinned portion having an upper surface and a lower surface opposite to each other and respectively defining an upper surface work portion and a lower surface work portion that are spaced apart from a plurality of ends of said thinned portion, said upper surface of said thinned portion facing said cavity, at least one of said two side portions having a recessed portion extending inwardly from a top surface thereof and communicating with said cavity, wherein said upper surface of said thinned portion and a bottom surface of said recessed portion are flush with each other;
a top electrode layer disposed on said upper surface of said thinned portion and having a top work portion disposed on said upper surface work portion of said thinned portion, and a top extension extending from said top work portion onto said bottom surface of said recessed portion; and
a bottom electrode layer disposed on said lower surface of said thinned portion and having a bottom work portion disposed on said lower surface work portion of said thinned portion, and a bottom extension extending from said bottom work portion toward said one end of said thinned portion and then bending upward and inward onto said bottom surface of said recessed portion.

2. The crystal oscillator as claimed in claim 1, wherein said bottom extension has a first section connected to said bottom work portion and extending toward said one end of said thinned portion, a second section extending upwardly from an outer end of said first section, and a third section extending inwardly from one end of said second section that is opposite to said first section onto said bottom surface of said at least one-recessed portion and spaced apart from said top extension.

3. A method of making a crystal oscillator, comprising the steps of:
   (a) forming a bottom electrode layer on a lower surface of a piezoelectric substrate, the bottom electrode layer having a bottom work portion spaced apart from a plurality of edges of the lower surface of the piezoelectric substrate, and a bottom extension extending from the bottom work portion toward one edge of the lower surface of the piezoelectric substrate;
   (b) adhering a temporary substrate to the lower surface of the piezoelectric substrate so as to cover the bottom electrode layer;
   (c) patterning an upper surface of the piezoelectric substrate that is opposite to the lower surface thereof so that the piezoelectric substrate is formed with a thinned portion and two side portions located on two opposite ends of the thinned portion, the thinned portion having the lower surface of the piezoelectric substrate and an upper surface opposite to the lower surface, the upper surface and the lower surface respectively defining an upper surface work portion and a lower surface work portion spaced apart from a plurality of ends of the thinned portion, the lower surface work portion being formed with the bottom work portion of the bottom electrode layer, at least one of the two side portions having a recessed portion extending inwardly from a top surface thereof, wherein the upper surface of the thinned portion and a bottom surface of the recessed portion are flush with each other;
   (d) forming a top electrode layer on the upper surface of the thinned portion, the top electrode layer having a top work portion located on the upper surface work portion, and a top extension extending from the top work portion onto the bottom surface of the recessed portion; and
   (e) removing the temporary substrate from the lower surface of the piezoelectric substrate to expose the bottom electrode layer.

4. The method as claimed in claim 3, wherein, in step (a), the bottom extension of the bottom electrode layer has a first section extending from the bottom work portion toward the one edge of the lower surface of the piezoelectric substrate.

5. The method as claimed in claim 4, wherein a step of forming a second section and a third section of the bottom electrode layer is performed after step (e), the second section extending upwardly from an outer end of the first section, the third section extending inwardly from one end of the second section that is opposite to the first section onto the bottom surface of the recessed portion and being spaced apart from the top extension.

6. The method as claimed in claim 4, wherein a step of forming a second section and a third section of the bottom electrode layer is performed after step (c), the second section extending upwardly from an outer end of the first section, the third section extending inwardly from one end of the second section that is opposite to the first section onto the bottom surface of the recessed portion and being spaced apart from the top extension.

* * * * *